US012658660B2

(12) United States Patent　　　　(10) Patent No.:　US 12,658,660 B2
Bosschaart et al.　　　　　　　　　 (45) Date of Patent:　　Jun. 16, 2026

(54) SEED LASER OPTICAL ISOLATOR, SEED ISOLATOR MODULE, EUV RADIATION SOURCE, LITHOGRAPHIC APPARATUS AND OPTICAL ISOLATOR OPERATING METHOD

(71) Applicant: ASML Netherlands B.V., Veldhoven (NL)

(72) Inventors: Karel Joop Bosschaart, Eindhoven (NL); Tomasz Czarnota, Waalre (NL); Heine Melle Mulder, Veldhoven (NL); Ruben Hendrik C Dilissen, Herentals (BE)

(73) Assignee: ASML Netherlands B.V., Veldhoven (NL)

( * ) Notice: Subject to any disclaimer, the term of this patent is extended or adjusted under 35 U.S.C. 154(b) by 206 days.

(21) Appl. No.: 18/568,515

(22) PCT Filed: May 16, 2022

(86) PCT No.: PCT/EP2022/063193
§ 371 (c)(1),
(2) Date: Dec. 8, 2023

(87) PCT Pub. No.: WO2022/258320
PCT Pub. Date: Dec. 15, 2022

(65) Prior Publication Data
US 2024/0275114 A1　　Aug. 15, 2024

(30) Foreign Application Priority Data
Jun. 9, 2021　(EP) ..................................... 21178433

(51) Int. Cl.
*H01S 3/00*　　　　(2006.01)
*G02F 1/11*　　　　(2006.01)
(Continued)

(52) U.S. Cl.
CPC .............. *H01S 3/0064* (2013.01); *G02F 1/11* (2013.01); *G03F 7/70033* (2013.01);
(Continued)

(58) Field of Classification Search
CPC .................................................... H01S 3/0064
See application file for complete search history.

(56) References Cited

U.S. PATENT DOCUMENTS

| | | | | |
|---|---|---|---|---|
| 2004/0051984 A1* | 3/2004 | Oshino | .................. | G02B 7/008 |
| | | | | 359/845 |
| 2013/0250985 A1* | 9/2013 | Xuan | ...................... | H01S 3/091 |
| | | | | 372/35 |

(Continued)

FOREIGN PATENT DOCUMENTS

| | | |
|---|---|---|
| GB | 2534937 A | 8/2016 |
| JP | S60-097320 A | 5/1985 |

(Continued)

OTHER PUBLICATIONS

International Search Report and Written Opinion of the International Searching Authority directed to International Patent Application No. PCT/EP2022/063193, mailed Aug. 22, 2022; 10 pages.

*Primary Examiner* — Edmond C Lau

(74) *Attorney, Agent, or Firm* — Finnegan, Henderson, Farabow, Garrett & Dunner LLP

(57) ABSTRACT

The present invention relates to an optical isolator for a seed laser, comprising: an acousto-optic modulator crystal configured to manipulate laser light incident thereto, and at least one cooling system configured to regulate a temperature of the crystal, said cooling system comprising: a cooling element including one or more channels for a fluidic cooling medium, a heat transfer assembly arranged between the crystal and the cooling element to transfer heat from the (Continued)

crystal to the cooling element, wherein the heat transfer assembly includes an active heat transfer element.

14 Claims, 3 Drawing Sheets

(51) Int. Cl.
*G03F 7/00* (2006.01)
*H01S 3/04* (2006.01)
*H05G 2/00* (2006.01)
*H01S 3/223* (2006.01)

(52) U.S. Cl.
CPC ........ *G03F 7/70891* (2013.01); *H01S 3/0405* (2013.01); *H05G 2/0082* (2024.08); *G02F 2203/21* (2013.01); *H01S 3/2232* (2013.01)

(56) References Cited

U.S. PATENT DOCUMENTS

| | | | |
|---|---|---|---|
| 2013/0322482 A1 | 12/2013 | Sandstrom et al. | |
| 2014/0346374 A1 | 11/2014 | Yanagida et al. | |
| 2016/0036194 A1* | 2/2016 | Sato | B23K 26/082 |
| | | | 359/345 |
| 2017/0074554 A1* | 3/2017 | He | F25B 21/00 |

FOREIGN PATENT DOCUMENTS

| | | | |
|---|---|---|---|
| JP | H11-237415 A | 8/1999 | |
| JP | 2005-043853 A | 2/2005 | |
| JP | 2008-158314 A | 7/2008 | |
| TW | 201413400 A | 4/2014 | |
| WO | WO 2021/073829 A1 | 4/2021 | |

* cited by examiner

SEED LASER OPTICAL ISOLATOR, SEED ISOLATOR MODULE, EUV RADIATION SOURCE, LITHOGRAPHIC APPARATUS AND OPTICAL ISOLATOR OPERATING METHOD

CROSS-REFERENCE TO RELATED APPLICATIONS

This application claims priority of EP application 21178433.5 which was filed on 9 Jun. 2021 and which is incorporated herein in its entirety by reference.

FIELD

The present invention relates to an optical isolator for a seed laser, a seed isolator module for an EUV source, and an EUV radiation source comprising a seed laser and a seed isolator module. The present invention further relates to a lithographic apparatus including an EUV radiation source and a method to operate an optical isolator.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

EUV radiation may be produced by illuminating tin droplets with radiation from a seed laser to ionize the tin atoms resulting in an intense plasma that radiates EUV radiation in all directions. Although the tin droplets absorb a large amount of the radiation from the seed laser, radiation is also reflected back towards the seed laser. In order to protect the seed laser, a seed isolator module with an optical isolator is used to absorb reflected laser light from the tin droplets.

Acousto-optic modulators (AOMs) may be used to absorb the reflected laser light by directing the laser light to a so-called beam dump. An AOM comprises a crystal that heats up due to absorbed laser light. Above a certain temperature threshold, irreversible damage may occur in the crystal. In case of crystal damage, the complete seed isolator module containing the AOM may need to be replaced. To avoid damage to the crystal, the crystal needs to be cooled which is currently provided by enclosing the crystal between copper blocks that are cooled by cooling water. With the current optical power of the seed laser, the cooling provides only a relatively small margin towards said temperature threshold. Therefore, the above solution is not optimal for high-power laser application, resulting in a too large risk of damage to the crystal. As mentioned above, when the crystal is damaged, the complete AOM may need to be substituted with corresponding costs and downtime of the apparatus.

SUMMARY

Considering the above, it is an object of the invention to provide an optical isolator with a reduced risk of laser induced damage to the crystal of the acousto-optic modulator.

According to an embodiment of the invention, there is provided an optical isolator for a seed laser, comprising:
an acousto-optic modulator crystal configured to manipulate laser light incident thereto, and
at least one cooling system configured to regulate a temperature of the crystal, said cooling system comprising:
a cooling element including one or more channels for a fluidic cooling medium, and
a heat transfer assembly arranged between the crystal and the cooling element to transfer heat from the crystal to the cooling element, wherein the heat transfer assembly includes an active heat transfer element.

According to another embodiment of the invention, there is provided a seed isolator module for an EUV source comprising an optical isolator according to the invention.

According to a further embodiment of the invention, there is provided an EUV radiation source comprising a seed laser and a seed isolator module according to the invention to absorb undesired reflected radiation originating from the seed laser.

According to yet another embodiment of the invention, there is provided a lithographic apparatus comprising an EUV radiation source according to the invention.

According to a further embodiment of the invention, there is provided a method to operate an optical isolator according to the invention, said method comprising the following steps:
a. providing a flow of cooling medium at a predetermined temperature through the cooling element,
b. transferring heat from the crystal to the cooling medium in the cooling element using the heat transfer assembly with the active heat transfer element such that a temperature of an outer surface of the crystal facing the heat transfer element is below the predetermined temperature of the cooling medium in the cooling element.

BRIEF DESCRIPTION OF THE DRAWINGS

Embodiments of the invention will now be described, by way of example only, with reference to the accompanying schematic drawings, in which.

DETAILED DESCRIPTION

Figure 1:
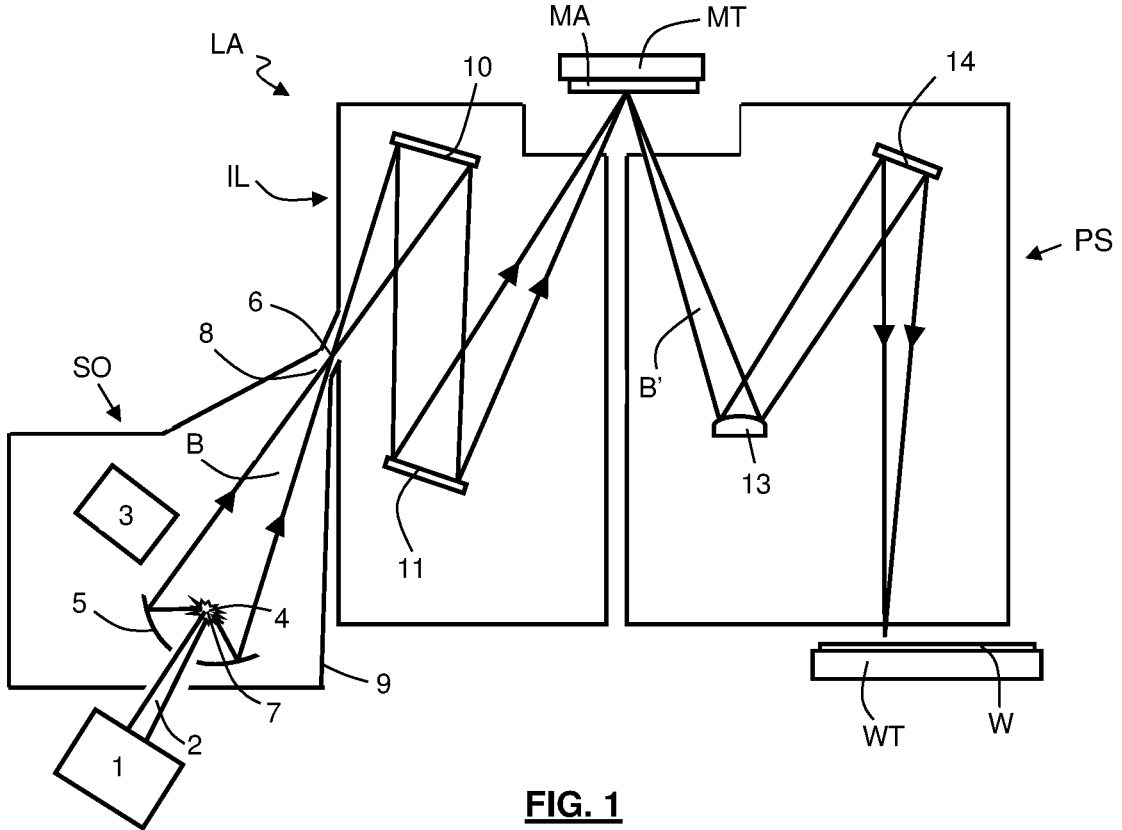
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Although the laser beam 2 is intended to be fully absorbed by the fuel, i.e. the tin droplets at the plasma formation region 4 to form the plasma 7, in practice, a portion of the laser beam 2 will be reflected from the tin droplets which reflected laser light may travel back towards the laser system 1. This may cause damage to the laser system 1 or interfere with the operation thereof.

Figure 2:
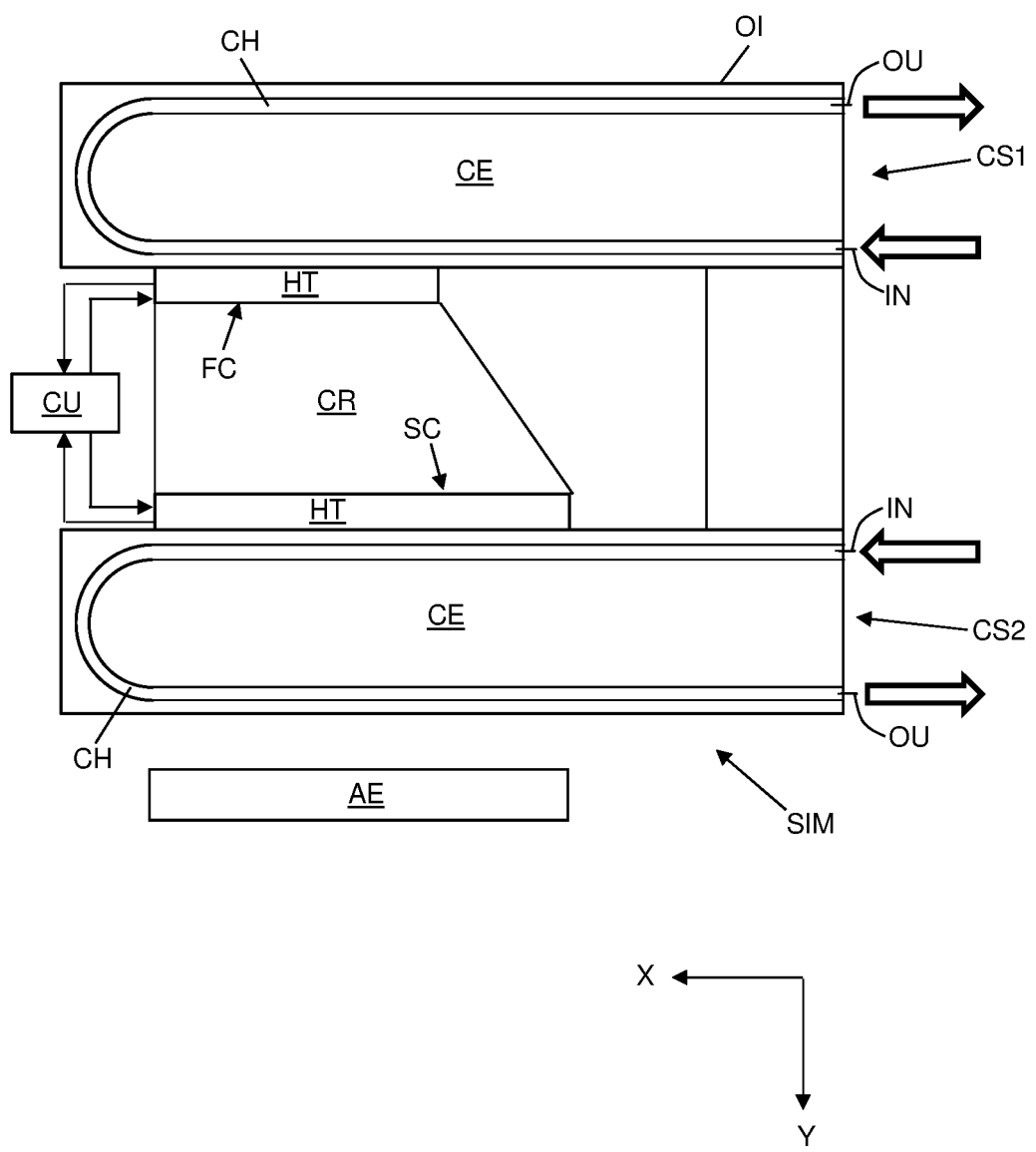
FIG. 2 depicts a seed isolator module according to an embodiment of the invention.

To prevent damage to the laser system 1, the laser system 1 or the radiation source SO may include a seed isolator module SIM as partially depicted in FIG. 2 to absorb the reflected laser light traveling back towards the laser system 1.

The seed isolator module SIM comprises an optical isolator OI and a control unit CU to control the optical isolator OI.

The optical isolator OI includes an acousto-optic modulator crystal CR to manipulate light incident thereto. In this example, the crystal CR is oriented such that the optical axis for laser light reflected back towards the laser system is perpendicular to the plane of the drawing in FIG. 2, i.e. is perpendicular to the X- and Y-axis depicted in FIG. 2. The present invention is not related to the working principle of the crystal CR itself and thus no detailed explanation will be included as the skilled person is already familiar with the working principle behind the acousto-optic modulator crystal CR. The crystal CR may be part of, e.g. as a separate component or as an integral component, an acousto-optic modulator including the components to introduce acoustic vibrations into the crystal CR. However, in summary, by subjecting the crystal CR to acoustic vibrations, the crystal CR is able to direct laser light reflected from the tin droplets towards an absorbing element AE also being part of the optical isolator OI or the seed isolator module SIM and depicted highly schematically in FIG. 2. The absorbing element AE may alternatively be referred to as beam dump. The laser beam 2 and reflected laser light will also be absorbed at least partially by the crystal CR itself resulting in heating of the crystal CR. When no measures are taken, the temperature of the crystal CR may increase to above a certain temperature threshold which may cause damage to the crystal CR resulting in at least a partial loss of function, but usually a complete loss of function within a short period of time.

The seed isolator module SIM may further include other components, such as optics, e.g. polarization protection optics not depicted here to keep the drawings simple.

To maintain the temperature of the crystal CR below a predetermined temperature, which predetermined temperature is preferably the temperature threshold minus a safety margin of at least a couple of degrees Celsius, the optical isolator OI comprises at least one cooling system. The embodiment of FIG. 2 is more extensive as the optical isolator OI comprises a first cooling system CS1 at a first crystal surface FC of the crystal CR and a second cooling system CS2 at a second crystal surface SC of the crystal CR, which first and second crystal surfaces FC, SC, are in this example parallel opposite surfaces of the crystal CR, so that the crystal CR can be cooled at two sides thereof.

The first and second cooling systems CS1, CS2 are in this case similar of construction and will thus be described simultaneously by reference to a cooling system although it is also envisaged that the construction of the first cooling system CS1 is different from the second cooling system depending on the cooling requirements of the crystal CR.

Similar in this context means that the first and second cooling systems have the same components with the same function. Being similar comprises the possibility that the first and second cooling systems are identical, but also comprises the situation that dimensions differ, e.g. due to the second crystal surface SC being larger than the first crystal surface as is the case in the embodiment of FIG. 2. Differences in dimensions or constructional differences may be caused by differences in available space or asymmetrical heating of the crystal CR.

The cooling systems CS1, CS2 of FIG. 2 include a cooling element CE including one or more channels CH for a fluidic cooling medium such as water. The cooling element CE including one or more channels CH are depicted highly schematically here as a cooling block with a single channel CH, an inlet IN to the channel CH, and an outlet OU of the channel CH. The channel CH may be connected to a cooling circuit providing cooling medium at a predetermined temperature to the inlet IN. The cooling medium in the channel CH is then able to absorb heat while flowing towards the outlet OU. The advantage of the cooling medium is that the heat can easily be removed and dumped to the environment at a location where less stringent temperature demands are present.

The cooling medium may be a liquid such as water or any other suitable liquid or may be a cooling gas such as air or any other suitable gas. The one or more channels may be closed channels, but may also be channels open at one side as is typically the case for a fin structure where gas is blown through the spaces in between the fins, where the fins provided sufficient cooling surface for heat transfer to the gas. The spaces in between the fins may be considered open channels.

The cooling systems CS1, CS2 of FIG. 2 further include a heat transfer assembly HT arranged between the crystal CR and the corresponding cooling element CE to transfer heat from the crystal CR to the cooling element CE and eventually to the cooling medium. The heat transfer assembly HT comprises an active heat transfer element, e.g. a Peltier element, which will be described below in more detail. The active heat transfer element transfers heat from the crystal side of the active heat transfer element to the cooling element side of the active heat transfer element. The crystal side of the active heat transfer element will alternatively be referred to as the cold side of the active heat transfer element and the cooling element side of the active heat transfer element will alternatively be referred to as the hot side. A temperature difference may be present between the cold side and the hot side during operation. A thermal resistance between the hot side and the cooling medium in the cooling element CE is preferably sufficiently low. The active heat transfer element is then able set a temperature of the cold side below the temperature of the fluidic cooling medium thereby lowering a temperature of the crystal CR compared to a situation in which the active heat transfer element is absent and heat is transported from the crystal CR to the cooling element CE mainly using (passive) conductive heat transfer.

In an embodiment, it may be possible to cool the cold side of the active heat transfer element and possibly other parts as well to below a dew-point of the surrounding air which may lead to condensation. To avoid condensation or minimize condensation the optical isolator may include a chamber or space including gas with conditions different from normal air, e.g. a dry purge gas environment like an N2 purge or extreme clean dry air.

The active heat transfer element, i.e. the Peltier element, can be open-loop controlled, but preferably closed-loop control is provided using the control unit CU. To this end, the heat transfer assembly preferably comprises a temperature sensor, as will be described below in more detail, to measure a temperature, which temperature can be used as a basis to drive the active heat transfer element. For instance, when providing a flow of cooling medium at a predetermined temperature through the cooling element, the temperature sensor may measure a temperature representative for a temperature of an outer surface of the crystal facing the active heat transfer element, and the control unit CU may be configured to drive the active heat transfer element in order to transfer heat from the crystal CR to the cooling medium in the cooling element CE using the heat transfer assembly with the active heat transfer element such that a temperature of an outer surface of the crystal facing the active heat transfer element is below the predetermined temperature of the cooling medium in the cooling element CE.

It is explicitly noted here that the embodiment of FIG. 2 is an extensive example and may be simplified. For instance, only one cooling system may be provided instead of two or an active heat transfer element such as a Peltier element is only provided in one of the two cooling systems.

The active heat transfer element may be a single component or may be an assembly of two or more separate sub-elements arranged in parallel and/or in series. This means that for instance two active heat transfer sub-elements, e.g. two Peltier elements, may be arranged next to each other to work in parallel to transfer heat from the crystal CR to the cooling element CE. When both the first cooling system CS1 and the second cooling system CS2 have an equal number of active heat transfer sub-element, the crystal CR is sandwiched between two pairs of active heat transfer sub-elements.

Figure 3:
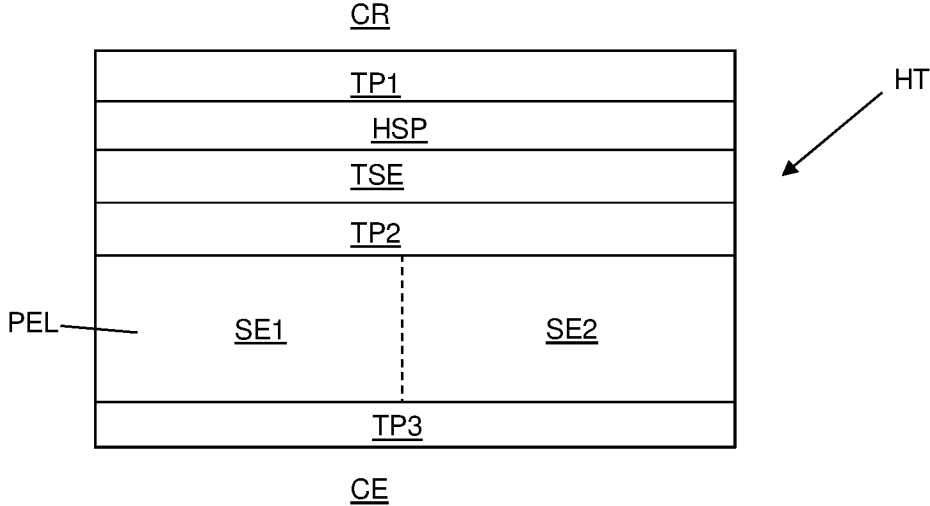
FIG. 3 depicts in more detail a heat transfer assembly of an optical isolator of the seed isolator module of FIG. 2.

FIG. 3 schematically depicts a heat transfer assembly HT of FIG. 2 in more detail. Indicated are the cooling element CE and the crystal CR at both sides of the heat transfer assembly HT. The heat transfer assembly HT in this example is a stack of the following layers starting at the crystal side of the heat transfer assembly HT:

Thermal contact layer TP1
Heat spreader layer HSP
Temperature sensor TSE
Thermal contact layer TP2
Peltier element PEL
Thermal contact layer TP3

The thermal contact layers TP1-TP3 are provided to improve the thermal contact between two adjacent layers by reducing a thermal resistance between the adjacent layers. Thermal contact layer TP1 is thus configured to reduce a thermal resistance between the crystal CR and the heat spreader layer HSP. It should be understood that the heat spreader layer HSP is thermal spreader layer wherein the thermal spreader layer is configured to distribute heat in plane of the thermal spreader layer. Thermal contact layer TP2 is configured to reduce the thermal resistance between the temperature sensor TSE and the Peltier element PEL, and thermal contact layer TP3 is configured to reduce a thermal resistance between the Peltier element PEL and the cooling element CE of FIG. 2.

The thermal contact layers TP1-TP3 may include elastic or deformable material, e.g. in the form of paste, that is able to adjust its shape to the irregularities in the material surfaces of the adjacent layers thereby increasing the effective surface area available for direct conductive heat transfer between the two adjacent layers. When there is sufficient effective surface area available for direct conductive heat transfer, e.g. because the material surfaces of the adjacent layers are smooth and well matching or because one of the layers is sufficiently deformable to adapt its shape to the other layer, no thermal contact layer may be provided.

The heat spreader layer HSP, which is preferably a highly conductive material e.g. a metal, for instance copper or aluminum, is provided to distribute heat from the crystal CR over the entire cross-section of the Peltier element PEL thereby improving the efficiency of the heat transfer assembly. This is advantageous when the crystal CR itself has a significantly lower thermal conductivity than the heat spreader layer HSP. When the thermal conductivity of the crystal is sufficiently high, the heat spreader layer HSP may be omitted. It is also possible that a thermal contact layer, e.g. thermal contact layer TP1 or TP2, provides a similar function as the heat spreader layer HSP.

The temperature sensor TSE provides the advantage that the temperature can be measured to allow closed-loop control of the Peltier element PEL. The temperature sensor TSE may be a separate layer as indicated in FIG. 3, and may comprise for instance an electrical wire of which the impedance is dependent on the temperature. However, the temperature sensor TSE may also be integrated in another layer, e.g. the heat spreader HSP.

As shown in FIGS. 2 and 3, the heat transfer assembly HT preferably matches the corresponding crystal surface it faces, but this is no necessary per se. Hence, the heat transfer assembly HT may be smaller or larger than the corresponding crystal surface. Further, although FIG. 3 indicates that the Peltier element extends across the entire cross-section of the heat transfer assembly HT, it is also envisaged that the Peltier element or sub-elements thereof only extend across a portion of the cross-section of the heat transfer assembly HT. The Peltier element PEL may be formed of a single Peltier device, but may alternatively be formed of two or more sub-elements SE1, SE2 indicated in dashed lines, each sub-element including a separate Peltier device.

Figure 4:
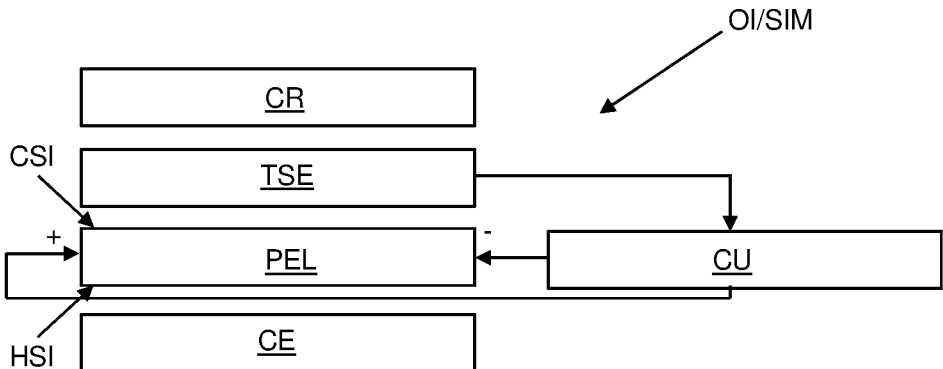
FIG. 4 depicts a schematic control scheme of an optical isolator or seed isolator module according to an embodiment of the invention.

FIG. 4 schematically depicts a control scheme of an optical isolator OI or seed isolator module SIM according to another embodiment of the invention. Schematically depicted is a stack of components including:

An acousto-optic modulator crystal CR. As it was above indicate this component may absorb radiation and heats up during use, A temperature sensor TSE, An active heat transfer element, in this embodiment a Peltier element PEL, and A cooling element CE.

The acousto-optic modulator crystal CR is part of an acousto-optic modulator used to direct radiation in a desired direction for absorption by a so-called beam dump.

The temperature sensor TSE and the active heat transfer element PEL are part of a heat transfer assembly in a simple embodiment. No thermal contact layers or heat spreader layers have been provided, but may be present to improve the heat transfer when necessary.

The cooling element CE is part of a cooling system to remove the heat from the optical isolator OI. Hence, the heat transfer assembly is configured to transfer heat from the crystal CR to the cooling element CE using the active heat transfer element PEL. In this embodiment, the active heat transfer element PEL may be a Peltier element. Given this direction of heat transfer, the crystal side of the active heat transfer element PEL is alternatively referred to as the cold side CSI of the Peltier element PEL and the cooling element side of the active heat transfer element PEL is alternatively referred to as the hot side HIS of the Peltier element PEL.

A control unit CU is provided to drive the Peltier element PEL based on an output of the temperature sensor TSE. The temperature sensor TSE is arranged at the cold side CSI of the Peltier element, i.e. between the Peltier element PEL and the crystal CR, allowing to effectively control the temperature of the crystal CR. The Peltier element PEL has two electrodes indicated using a "−" and a "+" symbol at the Peltier element PEL. By applying an appropriate voltage to the Peltier element PEL, the Peltier element will transfer heat from the cold side CSI to the hot side HSI of the Peltier element PEL. The control unit CU typically drives the Peltier element PEL such that a temperature at the cold side CSI of the Peltier element PEL as measured by the temperature sensor TSE is maintained at a desired temperature, alternatively referred to as setpoint.

Although the above embodiments relate to an EUV radiation source for a lithographic apparatus, the invention may readily be applied as well to other high-power radiation sources where acousto-optic modulators may be used to absorb radiation and need to be cooled sufficiently. An example of such another application is a radiation source for laser cutting. Hence, the optical isolator according to the present invention may be suitable for other high laser power environments, such as EUV or laser cutting. High laser power environments may be considered from 10 W, preferably from 100 W up to 1 kW, 10 kW, 100 kW or even higher.

Another embodiment of the invention describes a method to operate an optical isolator according to any of the embodiments of the present invention, wherein the method comprises the following steps:

a. providing a flow of cooling medium at a predetermined temperature through the cooling element, and b. transferring heat from the crystal to the cooling medium in the cooling element using the heat transfer assembly with the active heat transfer element such that a temperature of an outer surface of the crystal facing the active heat transfer element is below the predetermined temperature of the cooling medium in the cooling element.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An optical isolator for a seed laser, comprising:
an acousto-optic modulator crystal configured to manipulate laser light incident thereto, and
a first cooling system arranged at a first crystal surface of the acousto-optic modulator crystal; and
a second cooling system arranged at a second crystal surface of the acousto-optic modulator crystal,
wherein each of the first and second cooling systems comprise:
a cooling element including one or more channels configure to allow a fluidic cooling medium, and
a heat transfer assembly comprising an active heat transfer element, arranged between the crystal and the cooling element, and configured to transfer heat from the crystal to the cooling element.

2. The optical isolator of claim 1, wherein the active heat transfer element includes a Peltier element.

3. The optical isolator of claim 1, wherein the second crystal surface is opposite the first crystal surface.

4. The optical isolator of claim 1, wherein the first and second crystal surfaces are parallel to each other.

5. The optical isolator of claim 1, wherein:
the heat transfer assembly comprises a thermal contact layer arranged between the active heat transfer element and the cooling element, and
the thermal contact layer is configured to reduce a thermal resistance between the active heat transfer element and the cooling element.

6. The optical isolator of claim 1, wherein:
the heat transfer assembly comprises a thermal contact layer arranged between the crystal and the active heat transfer element, and
the thermal contact layer is configured to reduce a thermal resistance between the crystal and the active heat transfer element.

7. The optical isolator of claim 1, wherein:
the heat transfer assembly comprises a thermal spreader layer arranged between the crystal and the active heat transfer element, and
the thermal spreader layer is configured to distribute heat in plane of the thermal spreader layer.

8. The optical isolator of claim 1, wherein the heat transfer assembly comprises a temperature sensor arranged between the crystal and the cooling element to measure a temperature.

9. The optical isolator of claim 8, wherein the temperature sensor is arranged between the crystal and the active heat transfer element.

10. A seed isolator module for an EUV source comprising:
an optical isolator comprising:
an acousto-optic modulator crystal configured to manipulate laser light incident thereto, and
a first cooling system arranged at a first crystal surface of the acousto-optic modulator crystal; and
a second cooling system arranged at a second crystal surface of the acousto-optic modulator crystal,
wherein each of the first and second cooling systems comprise:
a cooling element including one or more channels configure to allow a fluidic cooling medium, and
a heat transfer assembly comprising an active heat transfer element, arranged between the crystal and the cooling element, and configured to transfer heat from the crystal to the cooling element.

11. The seed isolator module of claim 10, further comprising a control unit to drive the active heat transfer element of the heat transfer assembly.

12. The seed isolator module of claim 11, further comprising:
a temperature sensor arranged between the crystal and the cooling element to measure a temperature, and
wherein the control unit is configured to drive the active heat transfer element in dependency of an output of the temperature sensor.

13. A EUV radiation source comprising:
a seed laser; and
the seed isolator module of claim 10 configured to absorb undesired reflected radiation originating from the seed laser.

14. A lithographic system comprising the EUV radiation source of claim 13.

* * * * *